(12) United States Patent
Ezumi et al.

(10) Patent No.: US 8,466,718 B2
(45) Date of Patent: Jun. 18, 2013

(54) SEMICONDUCTOR DEVICE

(75) Inventors: Yoshiyuki Ezumi, Kanagawa (JP);
Fukashi Morishita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 105 days.

(21) Appl. No.: 13/081,957

(22) Filed: Apr. 7, 2011

(65) Prior Publication Data

US 2011/0248749 A1    Oct. 13, 2011

(30) Foreign Application Priority Data

Apr. 13, 2010   (JP) ................................. 2010-091942

(51) Int. Cl.
*H03K 3/00*    (2006.01)
(52) U.S. Cl.
USPC .......................................... 327/108; 327/112
(58) Field of Classification Search
USPC .......................................... 327/108–110, 112
See application file for complete search history.

(56) References Cited

U.S. PATENT DOCUMENTS

| 7,471,107 | B1 * | 12/2008 | Fortin et al. ...................... 326/83 |
| 7,619,448 | B2 * | 11/2009 | Wu et al. ......................... 327/108 |
| 7,635,990 | B1 * | 12/2009 | Ren et al. ......................... 326/86 |
| 7,902,883 | B2 * | 3/2011 | Hidaka ............................ 327/108 |
| 2009/0295955 | A1 | 12/2009 | Shimano |

FOREIGN PATENT DOCUMENTS

JP    2010-011432    1/2010

* cited by examiner

*Primary Examiner* — An Luu
(74) *Attorney, Agent, or Firm* — McDermott Will & Emery LLP

(57) ABSTRACT

Disclosed is a semiconductor device having an output driver and a driver replica. The output driver is based on a scalable low-voltage signaling technology and capable of operating on low power and making automatic adjustments of output characteristics in accordance with the magnitude of a reference current. The driver replica, which is a duplicate of the output driver, adjusts the magnitude of the reference current in accordance with the difference between its own output and a reference voltage and outputs the adjusted current to the output driver.

4 Claims, 6 Drawing Sheets

SEMICONDUCTOR DEVICE

CROSS-REFERENCE TO RELATED APPLICATIONS

The disclosure of Japanese Patent Application No. 2010-91942 filed on Apr. 13, 2010 including the specification, drawings, and abstract is incorporated herein by reference in its entirety.

BACKGROUND

The present invention relates to a semiconductor device and more particularly to a semiconductor device having an output driver.

Semiconductor devices such as CMOS (Complementary Metal Oxide Semiconductor) image sensors have an LVDS (Low Voltage Differential Signaling) interface or other differential interface capable of rapidly outputting data to the outside.

The LVDS described, for instance, in JP-A-2010-11432 includes a current value switching circuit, a transfer circuit, and an offset voltage holding circuit. The current value switching circuit switches between constant currents i1 and i2 (i1>i2). The transfer circuit handles a digital signal as a differential output signal and transmits it to an image processing circuit block, which is an external device. The offset voltage holding circuit ensures that the offset voltage of the differential output signal remains unchanged even when an operation mode changes.

SUMMARY

However, the LVDS interface described in JP-A-2010-11432 does not incorporate a characteristics judgment section and a control section although it includes a characteristics adjustment section. Therefore, this LVDS interface is limited in that it is necessary to build a characteristics adjustment sequence for handling an external device as well.

Further, the LVDS interface described in JP-A-2010-11432 includes the offset voltage holding circuit, which maintains the offset voltage of the differential output signal constant in order to adjust changes in the output characteristics that may be caused by temperature changes and other surrounding environment changes or by wafer-to-wafer process variations during manufacture. Therefore, many elements are coupled between a power supply and a ground. As this increases the number of cascoded levels, it is difficult to lower a supply voltage level for low-power design purposes.

The present invention has been made in view of the above circumstances and provides a semiconductor device having a driver capable of adjusting output characteristics automatically and operating on low power.

According to an embodiment of the present invention, there is provided a semiconductor device including an output driver and a driver replica. The output driver is based on a scalable low-voltage signaling technology and capable of making automatic adjustments of output characteristics in accordance with the magnitude of a first reference current. The driver replica, which is a duplicate of the output driver, adjusts the magnitude of the first reference current in accordance with the difference between its own output and a reference voltage and outputs the adjusted current to the output driver.

The driver included in the semiconductor device according to an embodiment of the present invention is capable of adjusting output characteristics automatically and operating on low power.

DETAILED DESCRIPTION

Figure 1:
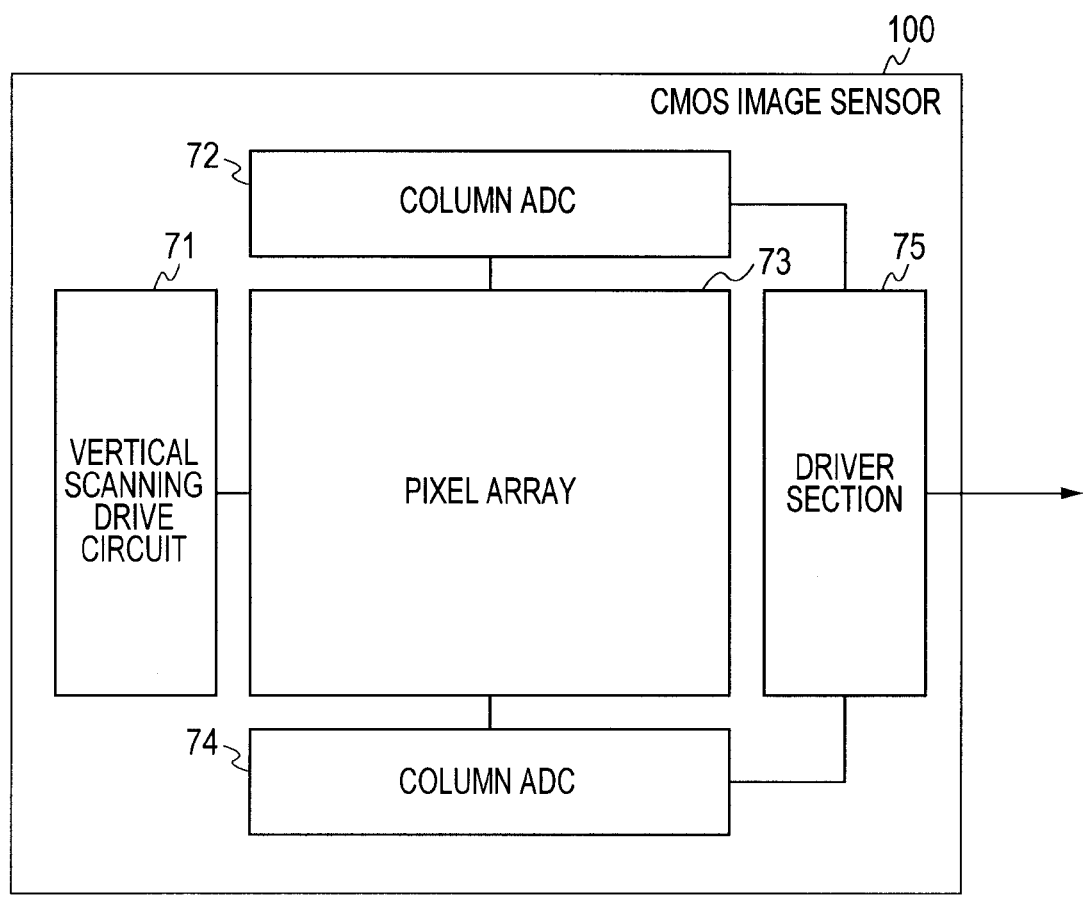
FIG. 1 is a diagram illustrating the configuration of a semiconductor device according to an embodiment of the present invention.

Embodiments of the present invention will now be described with reference to the accompanying drawings. FIG. 1 is a diagram illustrating the configuration of a semiconductor device according to an embodiment of the present invention.

Referring to FIG. 1, the semiconductor device 100 is a CMOS image sensor, which includes a pixel array 73 and a column ADC 72. The pixel array 73 is a matrix of pixels (CMOS sensors) that are arranged in rows and columns and used to convert light into an electrical signal. The column ADC 72 is provided for each column, receives an analog signal output from the pixel array 73, and converts the analog signal to a digital signal. The semiconductor device 100 also includes a vertical scanning drive circuit 71 and a driver section 75. The vertical scanning drive circuit 71 selects a row of the pixel array 73. The driver section 75 receives digital data from the column ADC 72 and outputs the digital data to an external image processing circuit.

First Embodiment

Figure 2:
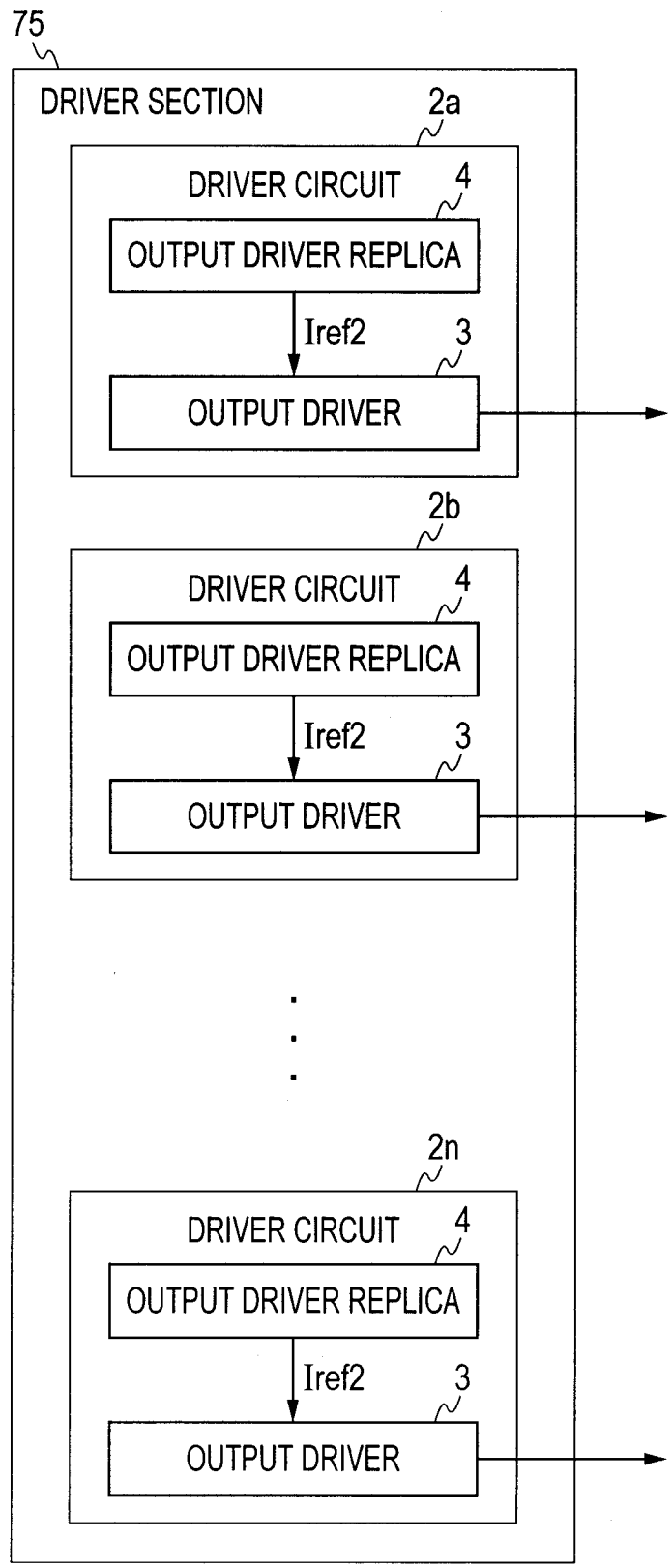
FIG. 2 is a diagram illustrating the configuration of a driver section according to a first embodiment of the present invention.

FIG. 2 is a diagram illustrating the configuration of the driver section according to a first embodiment of the present invention.

Referring to FIG. 2, the driver section 75 includes plural driver circuits 2a to 2n. The driver circuits 2a to 2n each include an output driver 3 and an output driver replica 4.

The output driver 3 is based on a scalable low-voltage signaling technology and capable of making automatic adjustments of output characteristics in accordance with the magnitude of a reference current Iref2.

The output driver replica 4 is a duplicate of the output driver 3. The output driver replica 4 adjusts the magnitude of the reference current Iref2 in accordance with the difference between its own output and a reference voltage and outputs the adjusted current to the output driver 3.

Figure 3:
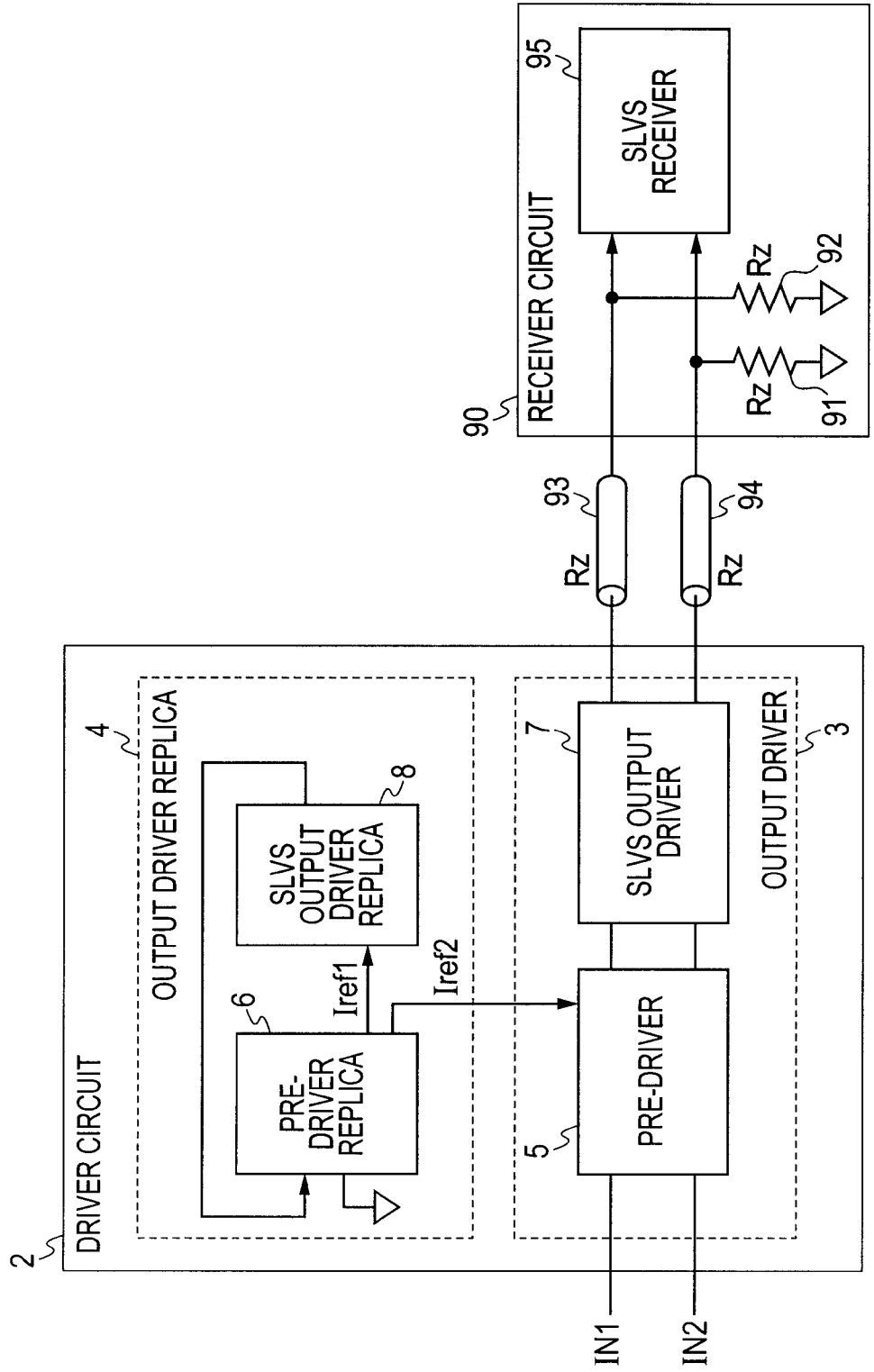
FIG. 3 is a diagram illustrating the driver circuit shown in FIG. 2 and a receiver circuit coupled to the driver circuit.

FIG. 3 is a diagram illustrating a driver circuit shown in FIG. 2 and a receiver circuit coupled to the driver circuit.

Referring to FIG. 3, the driver circuit 2 includes the output driver 3, which includes a pre-driver 5 and an SLVS (Scalable Low-Voltage Signaling) output driver 7. For example, an SLVS-400 driver compliant with JEDEC (Joint Electron Device Engineering Council) standards can be used as the SLVS output driver 7.

As the SLVS output driver 7 has a simple basic configuration, it cannot directly adjust output variations within itself like existing LVDS drivers. To adjust the output variations of the SLVS output driver 7, therefore, the driver circuit 2 also includes an output driver replica 4, which includes a pre-driver replica 6 and an SLVS output driver replica 8.

The SLVS output driver 7 and the SLVS output driver replica 8 do not have a differential common current source like the LVDS drivers and are driven by a supply voltage of as low as 0.8 V. Therefore, the SLVS output driver 7 and the SLVS output driver replica 8 reduce power consumption.

The receiver circuit 90 includes an SLVS receiver 95. Terminating resistors 91, 92 having an impedance of Rz (50Ω) are provided at the ends of differential transmission paths 93, 94. The differential transmission paths 93, 94 have a characteristic impedance equivalent to an impedance of Rz (50Ω).

The SLVS output driver replica 8 has an internal impedance of Rz (50Ω) so as to simulate the SLVS output driver 7.

The pre-driver replica 6 gives a reference current Iref1 to the SLVS output driver replica 8 and the reference current Iref2 to the pre-driver 5.

The output of the SLVS output driver replica 8 is fed back to the pre-driver replica 6 so as to adjust the values of the reference current Iref1 and reference current Iref2.

Figure 4:
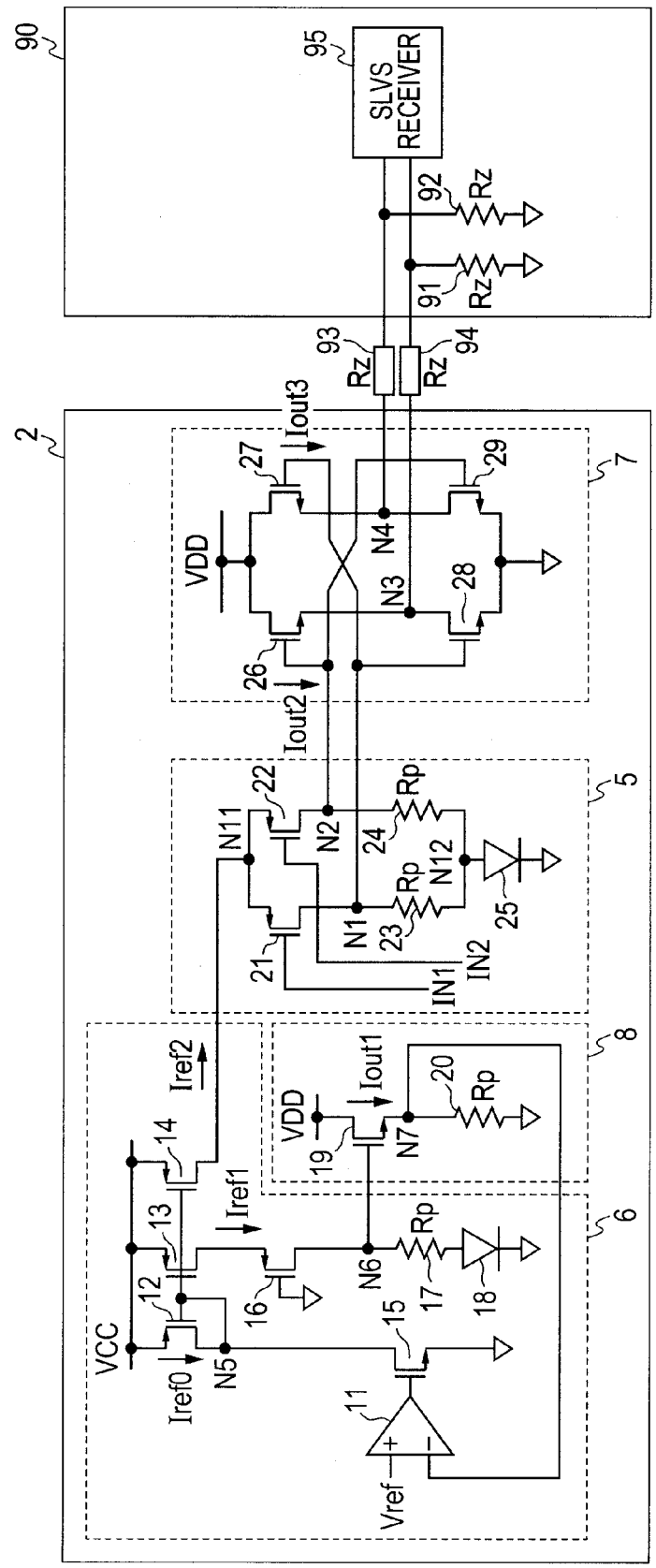
FIG. 4 is a diagram illustrating a detailed configuration of elements shown in FIG. 3.

FIG. 4 is a diagram illustrating a detailed configuration of elements shown in FIG. 3.

Pre-Driver Replica

The pre-driver replica 6 is a single-ended amplifier circuit that includes a comparator 11, an N-channel MOS transistor 15, a P-channel MOS transistor 12, a P-channel MOS transistor 13, a P-channel MOS transistor 14, a P-channel MOS transistor 16, a resistor 17 having an impedance of Rp, and a diode 18. The use of a single-ended amplifier reduces the area of the semiconductor device.

The P-channel MOS transistor 12, the P-channel MOS transistor 13, and the P-channel MOS transistor 14 are coupled to a VCC power supply (2.5 V) to form a current mirror.

A reference current Iref0 flows to the P-channel MOS transistor 12. The reference current Iref1 flows to the P-channel MOS transistor 13. The reference current Iref2 flows to the P-channel MOS transistor 14.

When the P-channel MOS transistor 12 has a gate width of W0 and a gate length of L0, the P-channel MOS transistor 13 has a gate width of W1 and a gate length of L1, and the P-channel MOS transistor 14 has a gate width of W2 and a gate length of L2, Iref0:Iref1:Iref2=(W0/L0):(W1/L1):(W2/L2).

The comparator 11 receives a reference voltage Vref and the voltage of a node N7. The N-channel MOS transistor 15 receives an output of the comparator 11.

When the reference voltage Vref is higher than the voltage of the node N7, the output voltage of the comparator 11 increases. This increases the value of the reference current Iref0, which flows to the N-channel MOS transistor 15.

When the reference voltage Vref is lower than the voltage of the node N7, the output voltage of the comparator 11 decreases. This decreases the value of the reference current Iref0, which flows to the N-channel MOS transistor 15.

The P-channel MOS transistor 16 is disposed between one end of the P-channel MOS transistor 13 and a node N6. The reference current Iref1 flows to the P-channel MOS transistor 16. A gate of the P-channel MOS transistor 16 is coupled to a ground.

The resistor 17 and the diode 18 are disposed between the node N6 and the ground.

SLVS Output Driver Replica

The SLVS output driver replica 8 is a single-ended amplifier circuit that includes an N-channel MOS transistor 19 and a resistor 20 having an impedance of Rz (50Ω). The use of a single-ended amplifier reduces the area of the semiconductor device.

The N-channel MOS transistor 19 is disposed between a VDD power supply (800 mV power supply) and the node N7. A gate of the N-channel MOS transistor 19 is coupled to the node N6 of the pre-driver replica 6. An output current Iout1 flows to the N-channel MOS transistor 19.

The resistor 20 having an impedance of Rz is disposed between the node N7 and the ground.

Pre-Driver

The pre-driver 5 is a differential amplifier circuit that includes a P-channel MOS transistor 21, a P-channel MOS transistor 22, a resistor 23 having an impedance of Rp, a resistor 24 having an impedance of Rp, and a diode 25.

The P-channel MOS transistor 21 is disposed between a node N11 and a node N1. The P-channel MOS transistor 22 is disposed between the node N11 and a node N2. The resistor 23 is disposed between the node N1 and a node N12. The resistor 24 is disposed between the node N2 and the node N12. The diode 25 is disposed between the node N12 and the ground.

The node N11 receives the reference current Iref2 output from the pre-driver replica 6. One signal IN1 of differential input signals enters a gate of the P-channel MOS transistor 21. The other signal IN2 of the differential input signals enters a gate of the P-channel MOS transistor 22. The node N1 and the node N2 are coupled to the SLVS output driver 7.

SLVS Output Driver

The SLVS output driver 7 is a differential amplifier circuit that includes an N-channel MOS transistor 26, an N-channel MOS transistor 27, an N-channel MOS transistor 28, and an N-channel MOS transistor 29.

The N-channel MOS transistor 26 is disposed between the VDD power supply (800 mV power supply) and a node N3. A gate of the N-channel MOS transistor 26 is coupled to the node N2. An output current Iout2 flows to the N-channel MOS transistor 26. Here, as VDD power is supplied from the outside, substantial power consumption reduction is achieved for a 2.5 V power supply driver such as an LVDS driver.

The N-channel MOS transistor 27 is disposed between the VDD power supply and a node N4. A gate of the N-channel MOS transistor 27 is coupled to the node N1. An output current Iout3 flows to the N-channel MOS transistor 27.

The N-channel MOS transistor 28 is disposed between the node N3 and the ground. A gate of the N-channel MOS transistor 28 is coupled to the node N1.

The N-channel MOS transistor 29 is disposed between the node N4 and the ground. A gate of the N-channel MOS transistor 29 is coupled to the node N2.

The node N4 is coupled to one transmission path 93 of the differential transmission paths. The node N3 is coupled to the other transmission path 94 of the differential transmission paths.

Adjustment Operation

Coupling the gate of the P-channel MOS transistor 16 the ground ensures that the input level for the pre-driver replica 6 is low. It simulates a state where one signal IN1 of the differential input signals is low.

When one signal IN1 of the differential input signals is low, the level of the output node N4 of the SLVS output driver 7 is high. Therefore, the reference voltage to be given to the comparator 11 is set so as to simulate such a state, or more specifically, set to a voltage of 0.4 V at which the level of the output node N4 is high.

When the output voltage of the node N7 of the SLVS output driver replica 8 is higher than the reference voltage Vref, the output voltage of the comparator 11 decreases. This decreases the value of the reference current Iref0, which flows to the P-channel MOS transistor 12 and the N-channel MOS transistor 15. This also decreases the value of the reference current Iref1, which flows to the P-channel MOS transistor 13. As a result, the magnitude of the output current Iout1, which flows to the N-channel MOS transistor 19, decreases to lower the output voltage of the node N7.

When, on the other hand, the output voltage of the node N7 of the SLVS output driver replica 8 is lower than the reference voltage Vref, the output voltage of the comparator 11 increases. This increases the value of the reference current Iref0, which flows to the P-channel MOS transistor 12 and the N-channel MOS transistor 15. This also increases the value of the reference current Iref1, which flows to the P-channel MOS transistor 13. As a result, the magnitude of the output current Iout1, which flows to the N-channel MOS transistor 19, increases to raise the output voltage of the node N7.

In addition to the above-described adjustments of the values of the reference currents Iref0, Iref1, the current mirror adjusts the value of the reference current Iref2 so that the level of the output node N4 of the SLVS output driver 7 is high when one signal IN1 of the differential input signals is low.

Operation Performed when IN1 is High and IN2 is Low

When one signal IN1 of the differential input signals is high, the P-channel MOS transistor 21 is off and the node N1 is low. This turns off the N-channel MOS transistor 27 and the N-channel MOS transistor 28.

When the other signal IN2 of the differential input signals is low, the P-channel MOS transistor 22 is on and the node N2 is high. This turns on the N-channel MOS transistor 26 and the N-channel MOS transistor 29.

In the above situation, therefore, a current flows sequentially to the VDD power supply, the N-channel MOS transistor 26, the node N3, the transmission path 94 having an impedance of Rz, the terminating resistor 91 having an impedance of Rz, the ground, the terminating resistor 92 having an impedance of Rz, the transmission path 93 having an impedance of Rz, the node N4, the N-channel MOS transistor 29, and the ground.

In the above instance, the SLVS receiver 95 detects that a logic of 0 is output from the driver circuit.

Operation Performed when IN1 is Low and IN2 is High

When one signal IN1 of the differential input signals is low, the P-channel MOS transistor 21 is on and the node N1 is high. This turns on the N-channel MOS transistor 27 and the N-channel MOS transistor 28.

When the other signal IN2 of the differential input signals is high, the P-channel MOS transistor 22 is off and the node N2 is low. This turns off the N-channel MOS transistor 26 and the N-channel MOS transistor 29.

In the above situation, therefore, a current flows sequentially to the VDD power supply, the N-channel MOS transistor 27, the node N4, the transmission path 93 having an impedance of Rz, the terminating resistor 92 having an impedance of Rz, the ground, the terminating resistor 91 having an impedance of Rz, the transmission path 94 having an impedance of Rz, the node N3, the N-channel MOS transistor 28, and the ground.

In the above instance, the SLVS receiver 95 detects that a logic of 1 is output from the driver circuit.

As described above, the semiconductor device according to the present embodiment uses the output driver replica to adjust the magnitude of the reference current to be supplied to the output driver. This permits the semiconductor driver to adjust changes in the output characteristics of the output driver and operate on low power. The pre-driver replica, which simulates the pre-driver, operates in accordance with the difference between the reference voltage and the output voltage of the SLVS output driver replica, which simulates the SLVS output driver, thereby adjusting the magnitude of the reference current to be supplied to the SLVS output driver replica and SLVS output driver. This makes it possible to adjust changes in the output of the SLVS output driver.

Modification of First Embodiment

The resistor 20 having an impedance of Rz, which is included in the SLVS output driver replica 8, simulates the impedances and terminating resistors 91, 92 of the transmission paths 93, 94.

It is preferred that the resistor 20 be placed under the same environmental conditions, such as temperature, as for the transmission paths 93, 94 and the terminating resistors 91, 92 of the transmission paths 93, 94. Therefore, the resistor 20 may be disposed outside a chip and coupled to the internal node N7 via pins.

Second Embodiment

Figure 5:
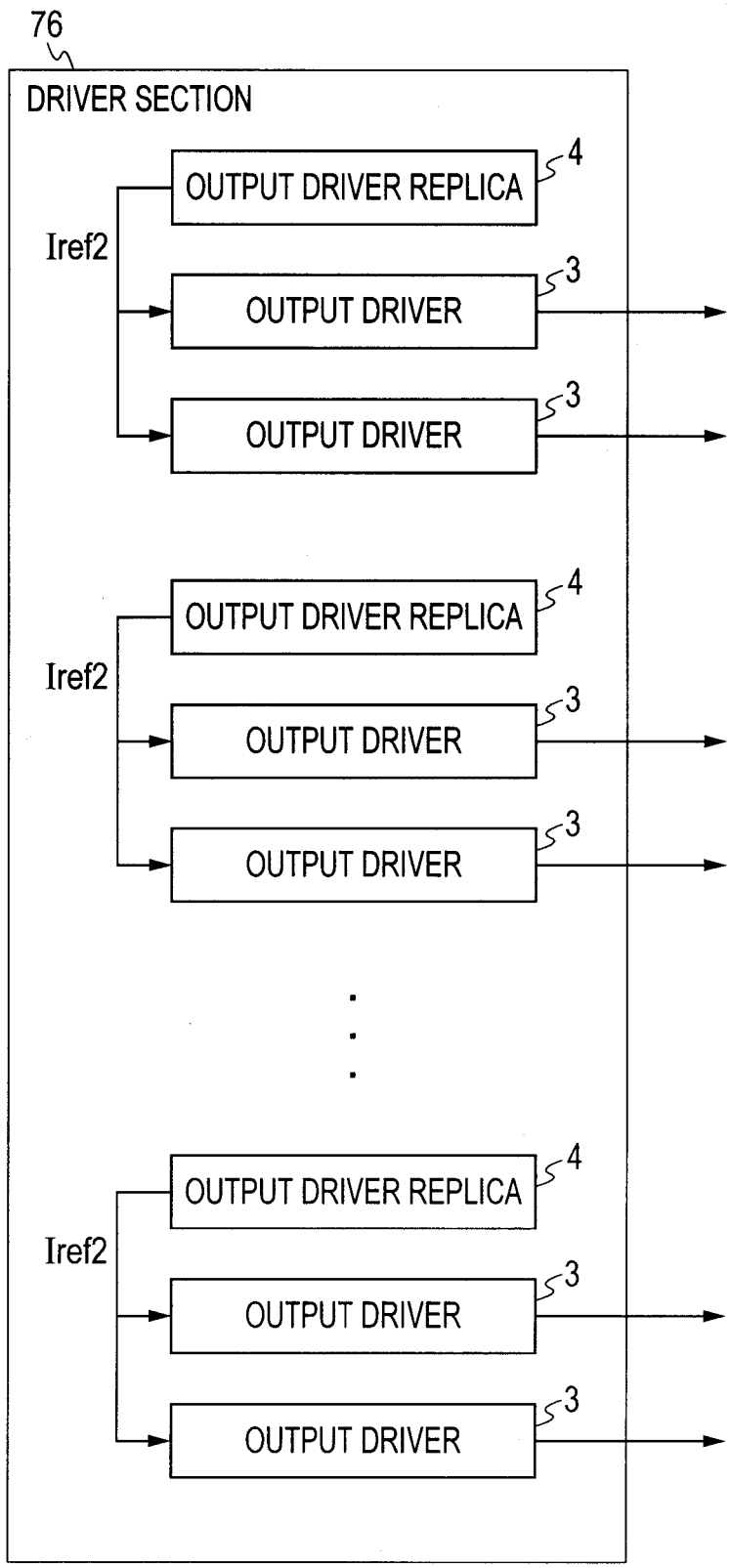
FIG. 5 is a diagram illustrating the configuration of the driver section according to a second embodiment of the present invention.

FIG. 5 is a diagram illustrating the configuration of the driver section according to a second embodiment of the present invention.

Referring to FIG. 5, the driver section includes plural output drivers 3 and plural output driver replicas 4. The output drivers 3 have the same configuration, and the configuration of each of these output drivers 3 is the same as indicated in FIG. 4. The output driver replicas 4 also have the same configuration, and the configuration of each of these output driver replicas 4 is the same as indicated in FIG. 4.

Each of the output driver replicas 4 outputs the reference current Iref2 to two output drivers 3.

Each of the output driver replicas 4, which outputs the reference current Iref2, is positioned close to the output drivers 3 that receive the reference current Iref2 output from each of the output driver replicas 4.

As described above, the number of output driver replicas in the present embodiment can be smaller than in a case where one output driver replica supplies the reference current Iref2 to one output driver. This makes it possible to reduce the area of the semiconductor device.

Modification of Second Embodiment

In the second embodiment, each of the output driver replicas outputs the reference current Iref2 to two output drivers 3. Alternatively, however, each of the output driver replicas may output the reference current Iref2 to more than two output drivers 3.

Third Embodiment

Figure 6:
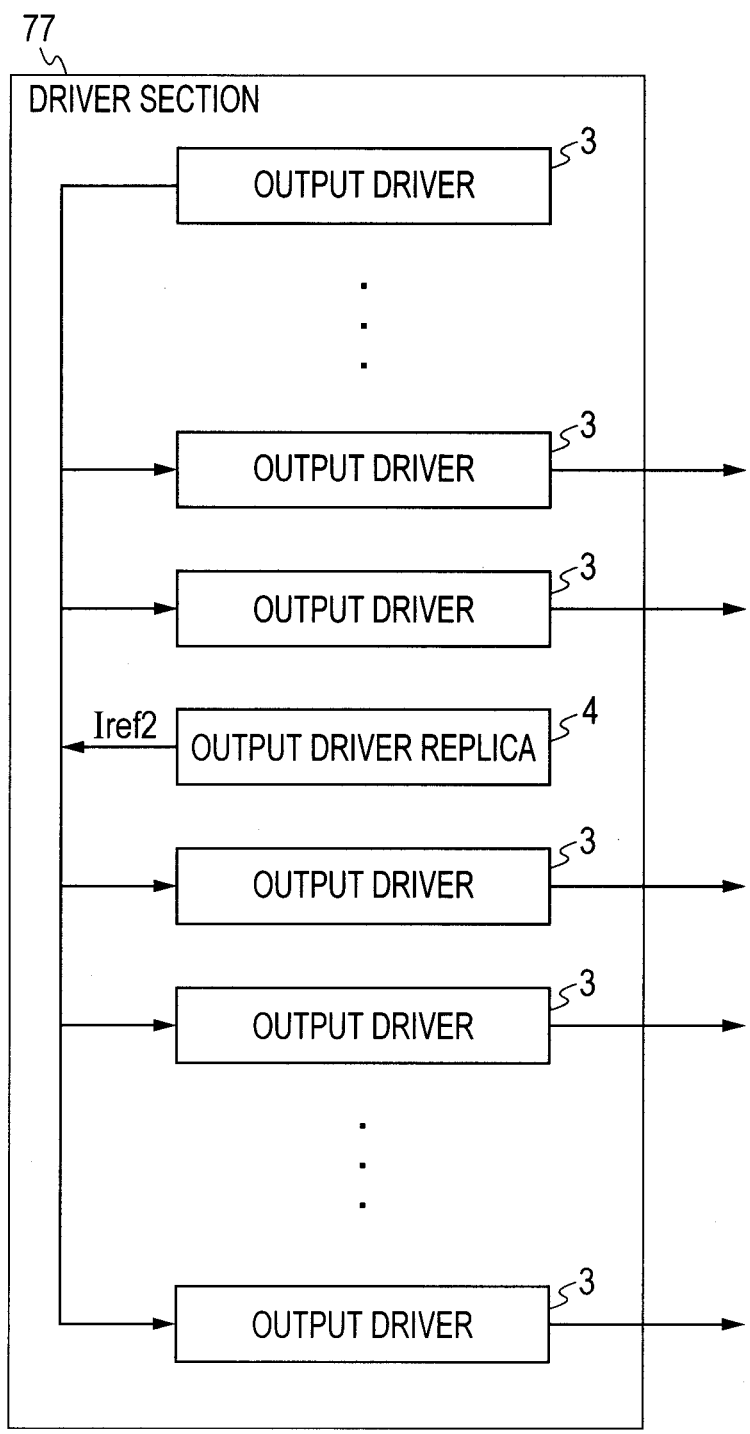
FIG. 6 is a diagram illustrating the configuration of the driver section according to a third embodiment of the present invention.

FIG. 6 is a diagram illustrating the configuration of the driver section according to a third embodiment of the present invention.

Referring to FIG. 6, the driver section includes plural output drivers 3 and one output driver replica 4. The output drivers 3 have the same configuration, and the configuration of each of these output drivers 3 is the same as indicated in FIG. 4. The configuration of the output driver replica 4 is the same as indicated in FIG. 4.

The output driver replica 4 outputs the reference current Iref2 to the output drivers 3.

The output driver replica 4 is positioned at the center of an area where the output drivers 3 are disposed.

As described above, the present embodiment requires only one output driver replica 4. This makes it possible to reduce the area of the semiconductor device. Further, the output driver replica 4 is positioned at the center of the area where the output drivers 3 are disposed. Therefore, the reference current output from the output driver replica 4 is efficiently supplied to the output drivers 3.

The presently disclosed embodiments are therefore considered in all respects to be illustrative and not restrictive. The scope of the invention is indicated by the appended claims rather than by the foregoing description. All changes which come within the meaning and range of equivalency of the claims are intended to be embraced therein.

What is claimed is:

1. A semiconductor device comprising:
    an output driver that is based on a scalable low-voltage signaling technology and capable of making automatic adjustments of output characteristics in accordance with the magnitude of a first reference current; and
    a driver replica that is a duplicate of the output driver;
    wherein the driver replica adjusts the magnitude of the first reference current in accordance with the difference between the output thereof and a reference voltage and outputs adjusted current to the output driver;
    wherein the output driver includes:
    an SLVS output driver; and
    a pre-driver that is disposed immediately before the SLVS output driver,
    wherein the driver replica includes:
    an SLVS output driver replica, which is a duplicate of the SLVS output driver; and
    a pre-driver replica, which is a duplicate of the pre-driver and disposed immediately before the SLVS output driver replica,
    wherein the SLVS output driver replica includes a resistor having the same impedance as a transmission path to which the SLVS output driver is coupled and as a terminating resistor placed at an end of the transmission path, and
    wherein the pre-driver replica includes:
    a comparator circuit, which outputs the difference between the output of the SLVS output driver replica and the reference voltage; and
    a current mirror circuit, which generates the first reference current to be supplied to the pre-driver as a drive current of the pre-driver and a second reference current that has a magnitude corresponding to the output of the comparator circuit and is to be supplied to the SLVS output driver replica.

2. The semiconductor device according to claim 1,
    wherein the SLVS output driver and the pre-driver are differential amplifier circuits, and
    wherein the SLVS output driver replica and the pre-driver replica are single-ended amplifier circuits.

3. The semiconductor device according to claim 1, comprising:
    a plurality of units of the output driver; and
    a plurality of units of the driver replica,
    wherein the units of the driver replica each output the first reference current to the units of the output driver.

4. The semiconductor device according to claim 1, comprising:
    a plurality of units of the output driver; and
    one unit of the driver replica,
    wherein the driver replica outputs the first reference current to the units of the output driver and is positioned at the center of an area where the units of the output driver are disposed.

* * * * *